United States Patent [19]

Zhang

[11] Patent Number: 5,396,133
[45] Date of Patent: Mar. 7, 1995

[54] HIGH SPEED CMOS CURRENT SWITCHING CIRCUITS

[75] Inventor: Zhong-Xuan Zhang, Fremont, Calif.

[73] Assignee: Cirrus Logic, Inc., Fremont, Calif.

[21] Appl. No.: 130,309

[22] Filed: Oct. 1, 1993

[51] Int. Cl.$^6$ ............................................ H03K 17/04
[52] U.S. Cl. .................................... 327/434; 327/108; 327/374
[58] Field of Search ................ 307/255, 571, 355, 448, 307/445, 603, 220

[56] References Cited

U.S. PATENT DOCUMENTS

| | | | |
|---|---|---|---|
| 3,600,608 | 8/1971 | Gilbert | 302/255 |
| 4,575,640 | 3/1986 | Lee | 307/529 |
| 4,677,323 | 6/1987 | Marsh | 302/521 |
| 4,831,282 | 5/1989 | Colles | 302/448 |
| 4,996,443 | 2/1991 | Tateno | 302/529 |
| 5,179,292 | 1/1993 | Lee | 302/255 |

Primary Examiner—John S. Heyman
Assistant Examiner—Dinh Le
Attorney, Agent, or Firm—Blakely, Sokoloff, Taylor & Zafman

[57] ABSTRACT

A high speed CMOS current switching circuit suitable for use in digital to analog converters for graphic interfaces having high pixel clock rates (high display resolutions), and such interfaces as may be used in portable and other battery operated or low power consumption applications. In operation, the current switching circuit normally steers an idle current to ground. If the bit of the digital to analog converter input digital signal represented by the respective source is a 1, the input signal representing the bit is delayed slightly while the current steered to ground is increased from the idle value to the full desired output current, whereupon at the end of the delay, the device coupling the output current to ground is turned off, thereby forcing the output current through an output device. A MOS transistor connected as a capacitor between the delayed signal input and the node determining the gate-source voltage of the output device reduces the time required to steer the output current from ground to the output device at the beginning of the pixel display time, and from the output device back to ground at the end of the pixel time. A specific circuit implementation is disclosed.

26 Claims, 3 Drawing Sheets

HIGH SPEED CMOS CURRENT SWITCHING CIRCUITS

BACKGROUND OF THE INVENTION

1. Field of the Invention

The present invention relates to the field of high speed CMOS current switching circuits, such as current sources and the like.

2. Prior Art

It is well known to use current steering circuits for supplying and selectively directing currents to one or more outputs. One use of such steering circuits is in digital to analog converters in graphic interfaces wherein a plurality of such current steering circuits are used to selectively supply current components to a resistor to convert multiple bit digital signals to corresponding analog signals for direct input to an RGB monitor. In such applications, one or both of two requirements may be particularly important. In particular, in high resolution displays, the pixel rate will be particularly high. In addition, it is desirable to have as much of the pixel time as possible to represent the true analog value of a digital signal, and as little of the pixel time as possible devoted to the rise and fall times of a respective analog signal. Accordingly, speed of operation of the digital to analog converters and thus of the current steering circuits for each bit of the digital signal is of particular importance in such applications.

Also, in portable computers, power consumption is an important consideration. Consequently, while a current steering circuit must provide the required current to the load when the corresponding bit of the multi-bit digital signal being converted is a 1, it is highly desirable for the current steering circuit to draw minimal current (power) when a respective input bit thereto is a 0. Accordingly, it is highly desirable to maximize the operating speed and minimize the current requirements of such current steering circuits in applications such as digital to analog converters for graphic interfaces so as to make the same devices useful in high resolution graphic applications, low power consumption applications and/or both such applications.

In U.S. Pat. No. 4,831,282, a CMOS circuit is disclosed comprising three P-channel MOS devices. As shown in FIG. 1 of that patent, the source of the first device is connected to +5 volts and its gate is connected to a circuit so as to establish a gate-source voltage in the first device to provide a fixed, predetermined current through the device. The drain of the first device is connected to a node common with the sources of the second and third devices, with the drain of the second device providing the output current and the drain of the third device being connected to ground. The gate of the second device is held at a reference voltage so that when the gate of the third device is high (higher than the reference voltage on the gate of a second device), the third device will be off and the node will assume a voltage to establish a gate-source voltage across the second device to turn the device on just enough to conduct the fixed current through the first device to the circuit output. When the gate of the third device is low, the third device is turned on, pulling the node lower in voltage to establish the gate-source voltage in the third device to conduct the current through the first device to ground, thereby lowering the gate-source voltage of the second device to turn off the current flow to the output.

In essence, the foregoing circuit establishes a known current source through the first device, and either steers that current to ground or to the output. As such, the circuit is relatively simple and is stated in the '282 patent to "operate satisfactorily at frequencies in excess of 85 megahertz (85 MHZ)." It has the disadvantage, however, of consuming a fixed amount of power per bit regardless of the input, as the same current is provided, independent of whether the bit is a 1 and the current is directed or steered to the output, or the bit is a 0 and the current is steered to ground.

In U.S. Pat. No. 5,179,292, CMOS circuits are disclosed which utilize four P-channel devices. In particular, in place of the single first device of the '282 patent, two devices in parallel are provided, one to establish a relatively small constant idle current and the other to provide a multiple of the idle current (such as, by way of example, fifteen times the idle current) upon the occurrence of the input bit being a 1. Thus, the idle current, normally directed to ground by one of the lower devices, establishes the node voltage, and only when a 1 bit is provided to the circuit is the current to the node increased to provide the full predetermined output current as desired. Accordingly, the power consumption of this circuit can be substantially less than in the circuit of the '282 patent because of its not consuming substantial power for 0 bit value inputs.

There is an advantage in being able to provide current switching circuits for use in graphic controller digital to analog converters which are of even higher speed and of low power consumption for high resolution and for battery operated computers. In that regard, it is desirable to minimize power consumption in all computers to allow closer component packing, smaller power supplies and lower operating temperatures with passive cooling as computers continue to become smaller and processing capability increases.

SUMMARY OF THE INVENTION

A high speed CMOS current switching circuit suitable for use in digital to analog converters for graphic interfaces having high pixel clock rates (high display resolutions), and such interfaces as may be used in portable and other battery operated or low power consumption applications. In operation, the current switching circuit normally steers an idle current to ground. If the bit of the digital to analog converter input digital signal represented by the respective source is a 1, the input signal representing the bit is delayed slightly while the current steered to ground is increased from the idle value to the full desired output current, whereupon at the end of the delay, the device coupling the output current to ground is turned off, thereby forcing the output current through an output device. A MOS transistor connected as a capacitor between the delayed signal input and the node determining the gate-source voltage of the output device reduces the time required to steer the output current from ground to the output device at the beginning of the pixel display time, and from the output device back to ground at the end of the pixel time. A specific circuit implementation is disclosed.

DETAILED DESCRIPTION OF THE INVENTION

Figure 1:
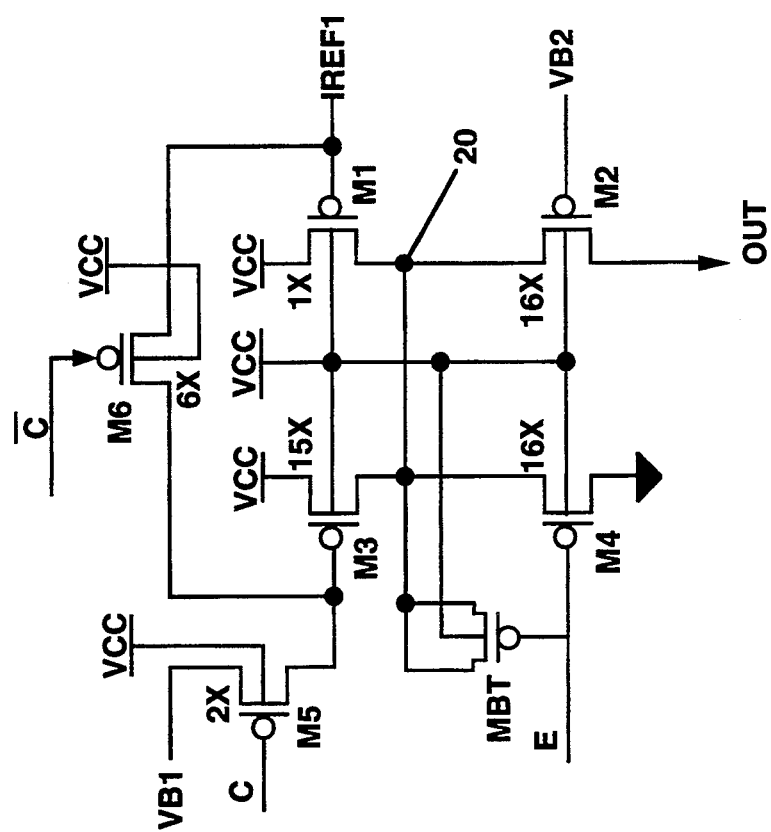
FIG. 1 presents the basic circuit for the current switching circuit of the present invention.

First referring to FIG. 1, the basic circuit for the current switching circuit of the present invention may be seen. In the preferred embodiment illustrated, the circuit is comprised of seven P-channel transistors. Transistor M1 has its source connected to Vcc and its gate connected to a reference voltage IREF1. Thus the gate-source voltage of transistor M1 is set to provide a relatively small and predetermined current through the transistor, subsequently referred to herein as an idle current. This current is provided by transistor M1 to node 20, which is a common connection for the drains of transistors M1 and M3 and the sources of transistors M2 and M4.

While transistor M1 provides an idle current to node 20 whenever power and reference voltages are applied thereto, the contribution of current through transistor M3 to node 20 will depend upon the gate to source voltage on transistor M3. If the gate voltage of transistor M3 is adequately elevated above IREF1, typically at or somewhat below Vcc, the transistor will be off, whereas if the gate voltage of transistor M3 is equal to the gate voltage of transistor M1, the current through transistor M3 will be mirrored from and thus equal to the current in transistor M1, ratioed (multiplied) by the relative size (width/length ratio) of transistor M3 and transistor M1. In that regard, in the preferred embodiment, the size of transistor M3 is fifteen times that of the size of transistor M1 so that when the gate of transistor M3 is at the same voltage as the gate of transistor M1, transistor M3 will conduct a current equal to 15 times the idle current in transistor M1.

As stated before, node 20 is connected to the sources of transistors M4 and M2. The drain of transistor M4 is connected to ground, with the drain of transistor M2 providing the current switching circuit output. The gate of transistor M2 is connected to a bias voltage, whereas the gate of transistor M4 is connected to an input signal E, a logic signal switching between the low state or voltage substantially at ground, and the high voltage approaching Vcc, dependent upon the specific input thereto. The bias voltage VB2 on the gate of transistor M2, on the other hand, is a voltage between these two extremes. Thus when the voltage of the input signal E is high, the gate-source voltage of transistor M4 will necessary be less than the gate-source voltage of transistor M2. Thus the current through transistor M1, and M3 if on, will raise the voltage of node 20 until the gate-source voltage of transistor M2 turns the same on to conduct the current in transistors M1 and M3 to the output OUT. If on the other hand, the signal E is low, the gate-source voltage of transistor M4 will necessarily be greater than the gate-source voltage of transistor M2, turning on transistor M4 and pulling the voltage of node 20 down sufficiently to turn off transistor M2.

Finally, with respect to the basic connections of the remaining transistors, transistor MBT is connected as a capacitor, having both diffused regions thereof (source and drain) connected to node 20 and its gate connected to the signal E. Transistor M5, on the other hand, is connected as a simple switch, being off or non conductive when the signal C is high, and conductive when the signal C is low to connect the gate of transistor M3 to VB1. Transistor M6 similarly operates as a switch, being off when the signal $\overline{C}$ is high and on when the signal $\overline{C}$ is low to connect the gate of transistor M3 to the same reference voltage IREF1 as set on the gate of transistor M1.

Figure 2:
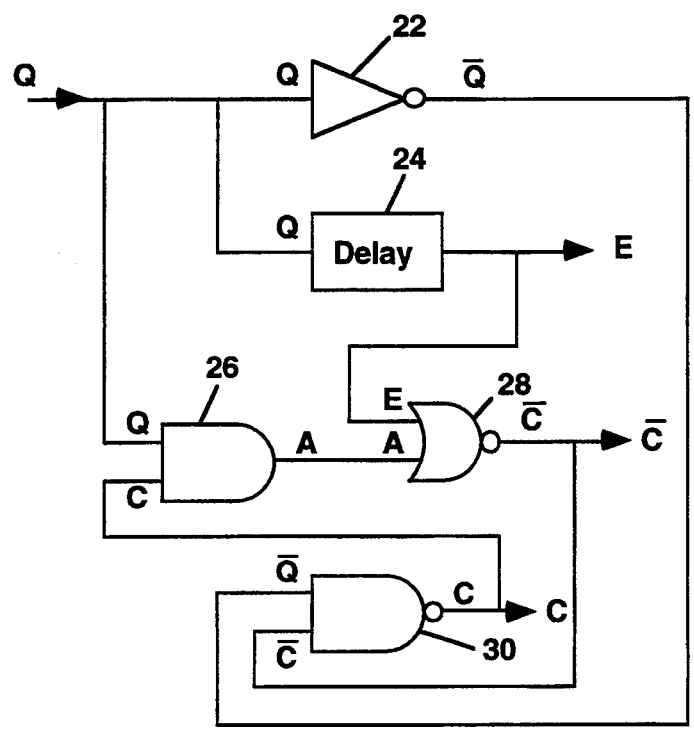
FIG. 2 shows the logic for generation of the C, $\overline{C}$ and E signals.
Figure 4:
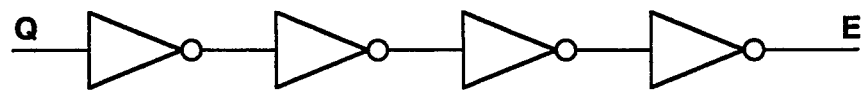
FIG. 4 shows a series of four inverters which impose the delay 24 of FIG. 2.
Figure 3:
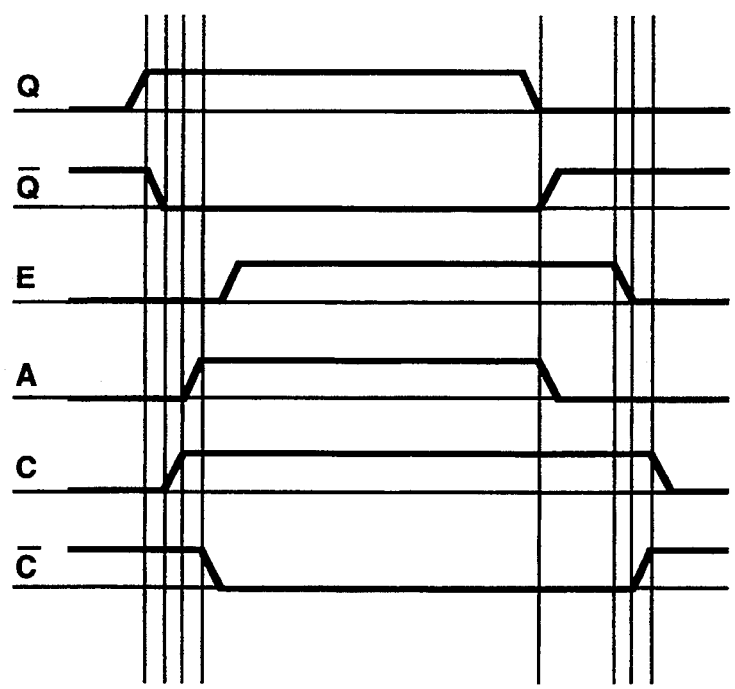
FIG. 3 illustrates the signal wave forms, exaggerated in some respects for clarity, of the various signals shown in FIG. 2.

Before describing the detailed operation of the circuit of FIG. 1, it is believed best to first describe the generation and sequencing of the input signals C, $\overline{C}$ and E. For this purpose, reference is made to FIG. 2, which shows the logic for generation of these signals. Reference is also made to FIG. 3, which generally illustrates the signal wave forms, exaggerated in some respects for clarity, of the various signals shown in FIG. 2. FIG. 3 illustrates non-overlapping signals C and $\overline{C}$ surrounding signal E generated by the circuit shown in FIG. 2. Referring now specifically to FIG. 2, the input to the circuit is the signal Q, which in a digital to analog converter in a graphic interface, would be a bit representing an incremental step in intensity of one of the three colors in an RGB system. As shown in FIG. 2, the signal Q is inverted by invertor 22 to provide the inverted signal $\overline{Q}$. Thus the signal $\overline{Q}$ is the inverse of the signal Q, as may be seen in FIG. 3. In that regard, the signal $\overline{Q}$ as the inverse of the signal Q is shown delayed slightly in FIG. 3, not for the reason that any intentional delay is imposed, but rather simply for purposes of illustration of the point that $\overline{Q}$ is responsive to Q rather than Q being responsive to $\overline{Q}$. Also as shown in FIG. 2, the signal Q is in fact intentionally delayed by delay 24 to provide the signal E replicating the signal Q, but with a now intentional delay. In that regard, the delay 24 of FIG. 2 is simply imposed by a series of four inverters, as shown in FIG. 4. In the preferred embodiment, each invertor is a fast response invertor, so that the total delay of the signal E with respect to signal Q is on the order of 1 nanosecond. Assuming for the moment that the circuit has settled with Q low, $\overline{Q}$ is of course high and E is low. Since Q is low, the output A of the AND gate 26 is also low. Since E and A are both low, the output $\overline{C}$ of NOR gate 28 will be high. With $\overline{C}$ and $\overline{Q}$ both high, the output C of NAND gate 30 will be low.

When Q first goes high, $\overline{Q}$ will follow by going low. This drives one input to NAND gate 30 low, driving the output C high, the transition in the signal C shown in FIG. 3 being delayed with respect to $\overline{Q}$ solely for purposes of separating the cause and effect of the signal transitions. With C and Q both high, the output A of AND gate 26 also goes high, and since one input of NOR gate 28 is now high, the output $\overline{C}$ thereof goes low in response thereto. In general, these transitions all occur within the delay of the delay circuit 24, so that after the foregoing described transitions, the delayed signal E finally goes high.

Q will go low when the respective bit goes low, either prior to the end of a pixel time, or if the corresponding bit remains unchanged for a number of pixel times, then prior to the end of that last pixel time. In any event, when Q goes low, both $\overline{Q}$ and A go low. Then at the end of the delay of delay circuit 24, E will go low, pulling $\overline{C}$ high which in turn pulls C low, placing the circuit in its original state awaiting the next time Q goes high again.

In the embodiment shown in FIG. 1, transistor M3 will conduct 15 times the current of transistor M1, and transistors M2 and M4 will conduct 16 times the current of transistor M1, assuming the same gate to source voltages thereon. Thus in the idle state when the input is low, the current through transistor M1 and M4 to ground is only one sixteenth that of the output current when the input is high. Also while the output is delayed somewhat compared with the input, this is a delay of only a fraction of a pixel time in a high resolution display.

In the foregoing description, the invention was disclosed in conjunction with a four transistor current switching circuit and the control thereof. The invention may also be used with a three transistor cell, wherein the fourth transistor acts as a capacitive boost to the cell to speed the operation thereof.

In any embodiment, the magnitude of the capacitance provided by transistor MBT is important to the speed-up of the circuit. If the capacitance is too low, less than all the speed-up will be realized. However if the capacitance is too large, the node 20 will rise almost in step with the drive signal E, turning transistor M2 on quickly, but then dumping much of the charge on the transistor MBT into the node and through transistor M2, converting what would have been a fast response to an overshoot in the output current. This characteristic, properly proportioned, can be beneficial in providing an initial charge surge in the output current to drive the capacitive loading on the output. In general, a good value for the capacitance of the transistor MBT is the value which, upon the signal E going high, will capacitively drive node 20 to approximately its stable voltage representing transistor's M2 on voltage and transistor's M4 off voltage, or depending on the output capacitance to be driven, slightly above the foregoing voltage. Also, while the source of transistor M5 may be connected to Vcc, making VB1=Vcc, it has been found that it is preferable to set VB1 to a reference voltage below Vcc by an amount slightly less than the threshold of transistor M3, still adequate to hold transistor M3 off when transistor M5 is on. In particular, making VB1 equal to Vcc charges the gate of transistor M3 and associated connections more than necessary to hold transistor M3 off. Then when transistor M5 turns off and transistor M6 turns on, this charge couples to IREF1, upwardly disturbing the same momentarily which in turn momentarily diminishes the current diverted from transistor M4 to the output. In a 5 volt embodiment of the present invention, setting VB1 to 4.2 volts by imposing a diode voltage drop from Vcc adequately holds transistor M3 off when transistor M5 is on, yet minimizes the foregoing undesired capacitive coupling.

While the present invention has been disclosed and described with respect to certain preferred embodiment, thereof, it will be understood to those skilled in the art that the present invention may be varied without departing from the spirit and scope of the invention.

I claim:

1. A high speed current switching circuit coupled and responsive to a digital signal comprising:
   first, second, third, fourth and fifth p-channel MOS devices, each having a source, a gate and a drain;
   the sources of the first and second MOS devices being coupled to a first voltage;
   the drains of the first and second MOS devices, the sources of the third and fourth MOS devices and the source and drain of the fifth MOS device being coupled together;
   the drain of the third MOS device being coupled to a second voltage which is a lower voltage than the first voltage;
   the drain of the fourth MOS device being coupled to a current output for the current switching circuit;
   the gate of the first MOS device being coupled to a first reference voltage so that the gate to source voltage of the first MOS device establishes a predetermined current through the first MOS device;
   the gate of the fourth MOS device being coupled to a third voltage intermediate a first digital signal level and a second digital signal level of the digital signal;
   the gates of the third and fifth MOS devices being coupled together; and,
   means coupled to the digital signal for turning the second MOS device on to provide a predetermined current through the second MOS device and for turning the third MOS device off responsive to the digital signal changing to the second digital signal level.

2. The high speed current switching circuit of claim 1 wherein the means coupled to the digital signal for turning the second MOS device on to provide a predetermined current through the second MOS device and for turning the third MOS device off responsive to the digital signal changing to the second digital signal level comprises a means to turn the second MOS device on a predetermined length of time before turning the third MOS device off.

3. The high speed current switching circuit of claim 2 wherein the means to turn the second MOS device on a predetermined length of time before turning the third MOS device off comprises a sixth MOS device having a source, a gate and a drain, the source and drain of the sixth MOS device being coupled in series between the gates of the first and the second MOS devices, and the gate of the sixth MOS device being coupled to the digital signal.

4. The high speed current switching circuit of claim 3 further comprised of means for holding the second MOS device off prior to the digital signal changing to the second digital signal level.

5. The high speed current switching circuit of claim 4 wherein the means for holding the second MOS device off prior to the digital signal changing to the second digital signal level comprises a seventh MOS device having a source, a gate and a drain, the source of the seventh MOS device being coupled to a second reference voltage and the drain of the seventh MOS device being coupled to the gate of the second MOS device, and the gate of the seventh MOS device being coupled to the digital signal.

6. The high speed current switching circuit of claim 5 wherein the second reference voltage is a voltage at least as high as the first voltage minus the threshold of the second MOS device.

7. The high speed current switching circuit of claim 5 wherein the second reference voltage is equal to the first voltage.

8. The high speed current switching circuit of claim 5 wherein the current through the second MOS device is substantially larger than the current through the first MOS device when the gate of the second MOS device is at the same voltage as the gate of the first MOS device.

9. A high speed current switching circuit coupled and responsive to a current switching circuit control digital signal comprising:

first, second, third, fourth and fifth p-channel MOS devices, each having a source, a gate and a drain;

the sources of the first and second MOS devices being coupled to a first voltage;

the drains of the first and second MOS devices, the sources of the third and fourth MOS devices and the source and drain of the fifth MOS device being coupled together;

the drain of the third MOS device being coupled to a second voltage which is a lower voltage than the first voltage;

the drain of the fourth MOS device being coupled to a current output for the current switching circuit;

the gate of the first MOS device being coupled to a first reference voltage so that the gate to source voltage of the first MOS device establishes a predetermined current through the first MOS device;

the gate of the fourth MOS device being coupled to a third voltage selected to cause the fourth MOS device to turn on and off in response to a gate voltage on the third MOS device rising above and falling below a level intermediate a first digital signal level and a second digital signal level;

the gates of the third and fifth MOS devices being coupled together; and, a circuit coupled to the current switching circuit control digital signal for turning the second MOS device on to provide a predetermined current through the second MOS device and for turning the third MOS device off responsive to the current switching circuit control digital signal.

10. The high speed current switching circuit of claim 9 wherein the circuit for turning the second MOS device on to provide a predetermined current through the second MOS device and for turning the third MOS device off responsive to a current switching circuit control digital signal comprises a circuit to turn the second MOS device on a predetermined length of time before turning the third MOS device off.

11. The high speed current switching circuit of claim 10 wherein the circuit to turn the second MOS device on a predetermined length of time before turning the third MOS device off is a circuit for turning on the second MOS device responsive to the current switching circuit control digital signal, and a delay circuit responsive to the current switching circuit control digital signal to turn the third MOS device off the predetermined length of time after the second MOS device is turned on.

12. The high speed current switching circuit of claim 11 wherein the circuit for turning the second MOS device on a predetermined length of time before turning the third MOS device off includes a sixth MOS device having a source, a gate and a drain, the source and drain of the sixth MOS device being coupled in series between the gates of the first and the second MOS devices, and the gate of the sixth MOS device being coupled to the digital signal.

13. The high speed current switching circuit of claim 11 further comprised of a circuit for holding the second MOS device off prior to a change in the current switching circuit control digital signal.

14. The high speed current switching circuit of claim 13 wherein the circuit for holding the second MOS device off prior to the current switching circuit control digital signal comprises a seventh MOS device having a source, a gate and a drain, the source of the seventh MOS device being coupled to a second reference voltage and the drain of the seventh MOS device being coupled to the gate of the second MOS device, and the gate of the seventh MOS device being coupled to the digital signal.

15. The high speed current switching circuit of claim 14 wherein the second reference voltage is a voltage at least as high as the first voltage minus the threshold of the second MOS device.

16. The high speed current switching circuit of claim 14 wherein the second reference voltage is equal to the first voltage.

17. The high speed current switching circuit of claim 14 wherein the current through the second MOS device is substantially larger than the current through the first MOS device when the gate of the second MOS device is at the same voltage as the gate of the first MOS device.

18. A method of providing a high speed current switching circuit coupled and responsive to a digital signal having first and second states comprising the steps of:

(a) providing;

first, second, third, fourth and fifth p-channel MOS devices, each having a source, a gate and a drain;

the sources of the first and second MOS devices being coupled to a first voltage;

the drains of the first and second MOS devices, the sources of the third and fourth MOS devices and the source and drain of the fifth MOS device being coupled together;

the drain of the third MOS device being coupled to a second voltage which is a lower voltage than the first voltage;

the drain of the fourth MOS device being coupled to the current output for the current switching circuit;

the gate of the first MOS device being coupled to a reference voltage so that the gate to source voltage of the first MOS device establishes a predetermined current through the first MOS device;

the gate of the fourth MOS device being coupled to a third voltage intermediate a first digital signal level and a second digital signal level of a digital signal;

the gates of the third and fifth MOS devices being coupled together;

(b) when the digital signal is in the first state, holding the second MOS device off and the third MOS device on;

(c) when the digital signal changes to the second state;
  i) turning on the second MOS device;
  ii) then turning off the third MOS device;

(d) when the digital signal returns to the first state;
  i) turning on the third MOS device;
  ii) then turning off the second MOS device.

19. The method of claim 18 wherein in step (c), the second MOS device is turned on by coupling the gates of the first and second MOS devices together.

20. The method of claim 18 wherein in steps (d) and (b) respectively, the second MOS device is turned off and held off by coupling the gate of the second MOS device to a second reference voltage.

21. The method of claim 20 wherein the second reference voltage is a voltage at least as high as the first voltage minus the threshold of the second MOS device.

22. The high speed current switching circuit of claim 20 wherein the second reference voltage is equal to the first voltage.

23. The method of claim 18 wherein in step (c), the second MOS device is turned on by coupling the gates of the first and second MOS devices together, and wherein in steps (d) and (b) respectively, the second MOS device is turned off and held off by coupling the gate of the second MOS device to a second reference voltage.

24. The method of claim 23 wherein the second reference voltage is a voltage at least as high as the first voltage minus the threshold of the second MOS device.

25. The high speed current switching circuit of claim 23 wherein the second reference voltage is equal to the first voltage.

26. A high speed current switching circuit coupled and responsive to a digital input signal comprising:

first, second, third and fourth p-channel MOS devices, each having a source, a gate and a drain;

the source of the first MOS device being coupled to a first voltage;

the drain of the first MOS device, the sources of the second and third MOS devices and the source and drain of the fourth MOS device being coupled together;

the drain of the second MOS device being coupled to a second voltage which is a lower voltage than the first voltage;

the drain of the third MOS device being coupled to the current output for the current switching circuit;

the gate of the first MOS device being coupled to a reference voltage so that the gate to source voltage of the first MOS device establishes a predetermined current through the first MOS device;

the gate of the third MOS device being coupled to a third voltage selected to cause the third MOS device to turn on and off in response to a gate voltage on the second MOS device rising above and falling below a level intermediate a first digital input signal level and a second digital input signal level; and, the gates of the second and fourth MOS devices being coupled to the digital input signal.

* * * * *